(12) United States Patent
Okamura et al.

(10) Patent No.: US 11,611,162 B1
(45) Date of Patent: Mar. 21, 2023

(54) APPARATUS, SYSTEM, AND METHOD FOR REDUCING CHASSIS DEPTHS IN CONNECTION WITH POWER SUPPLY UNITS

(71) Applicant: Juniper Networks, Inc., Sunnyvale, CA (US)

(72) Inventors: Katsuhiro Okamura, Sunnyvale, CA (US); Sriram Gopalaratnam, Sunnyvale, CA (US); Mahesh Nagarajan, Sunnyvale, CA (US); Marshall J. Lise, Sunnyvale, CA (US)

(73) Assignee: Juniper Networks, Inc, Sunnyvale, CA (US)

( * ) Notice: Subject to any disclaimer, the term of this patent is extended or adjusted under 35 U.S.C. 154(b) by 274 days.

(21) Appl. No.: 17/023,412

(22) Filed: Sep. 17, 2020

(51) Int. Cl.
| | |
|---|---|
| *H01R 9/24* | (2006.01) |
| *H01R 9/22* | (2006.01) |
| *H05K 7/14* | (2006.01) |
| *H01R 11/12* | (2006.01) |
| *H01R 4/30* | (2006.01) |

(52) U.S. Cl.
CPC ............. *H01R 9/24* (2013.01); *H01R 9/223* (2013.01); *H01R 11/12* (2013.01); *H05K 7/1492* (2013.01); *H01R 4/30* (2013.01)

(58) Field of Classification Search
CPC ... H01R 4/26; H01R 4/28; H01R 4/30; H01R 9/24; H01R 9/223; H01R 11/12
USPC ............... 361/679; 174/74 R, 78, 84 R, 88 R
See application file for complete search history.

(56) References Cited

U.S. PATENT DOCUMENTS

| | | | | |
|---|---|---|---|---|
| 1,691,088 A | * | 11/1928 | Starke ................. | H01R 9/2408 439/717 |
| 2,892,176 A | * | 6/1959 | Gordon ................ | H01R 9/2408 439/721 |
| 5,989,073 A | * | 11/1999 | Kahoun ............... | H01R 9/2491 439/651 |

FOREIGN PATENT DOCUMENTS

FR 2652173 A1 * 3/1991 ............... G06F 3/00

* cited by examiner

*Primary Examiner* — William H. Mayo, III
(74) *Attorney, Agent, or Firm* — Greenberg Traurig, LLP

(57) ABSTRACT

An apparatus may include (1) a terminal connector configured to be electrically coupled to a power interface of a computing device, (2) an inline terminal block assembly that is independent of the terminal connector, (3) at least one terminal-side power cable configured to be electrically coupled between the terminal connector and the inline terminal block assembly, and (4) at least one distribution-side power cable configured to be electrically coupled between the inline terminal block assembly and a power distribution system.

20 Claims, 8 Drawing Sheets

APPARATUS, SYSTEM, AND METHOD FOR REDUCING CHASSIS DEPTHS IN CONNECTION WITH POWER SUPPLY UNITS

BACKGROUND

Telecommunications systems (such as routers and/or switches) often call for and/or necessitate Direct Current (DC) power for operation. To facilitate the distribution of such DC power, some conventional telecommunications systems may be designed to accept power supply units via DC terminal blocks. In some examples, the DC terminal blocks may be incorporated into the power supply units, which are often coupled to the back of the telecommunications systems' chassis and/or housings. Unfortunately, such power supply units may be fairly large in size and thus consume a significant amount of space in places (e.g., datacenters) where such space is limited, costly, and/or in high demand.

Accordingly, the size and/or dimensions of such power supply units may present certain spatial challenges and/or constraints for datacenters and/or their administrators. For example, the size and/or dimensions of such power supply units may add significantly to the overall depth requirements of the telecommunications systems. The instant disclosure, therefore, identifies and addresses a need for apparatuses, systems, and methods for reducing chassis depths in connection with power supply units.

SUMMARY

As will be described in greater detail below, the instant disclosure generally relates to apparatuses, systems, and methods for reducing chassis depths in connection with power supply units. In one example, an apparatus for accomplishing such a task may include (1) a terminal connector configured to be electrically coupled to a power interface of a computing device, (2) an inline terminal block assembly that is independent of the terminal connector, (3) at least one terminal-side power cable configured to be electrically coupled between the terminal connector and the inline terminal block assembly, and (4) at least one distribution-side power cable configured to be electrically coupled between the inline terminal block assembly and a power distribution system.

Similarly, a system for accomplishing such a task may include (1) a computing device, (2) a terminal connector configured to be electrically coupled to a power interface of the computing device, (3) an inline terminal block assembly that is independent of the terminal connector, (4) at least one terminal-side power cable configured to be electrically coupled between the terminal connector and the inline terminal block assembly, and (5) at least one distribution-side power cable configured to be electrically coupled between the inline terminal block assembly and a power distribution system.

A corresponding method may include (1) electrically coupling a terminal connector to a power interface on a back of a computing device housing, (2) electrically coupling at least one terminal-side power cable between the terminal connector and an inline terminal block assembly that is independent of the terminal connector, (3) electrically coupling at least one distribution-side power cable between the inline terminal block and a power distribution system, and (4) mounting the inline terminal block to a side of the computing device housing such that the terminal connector and the inline terminal block are physically separated from one another.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1:
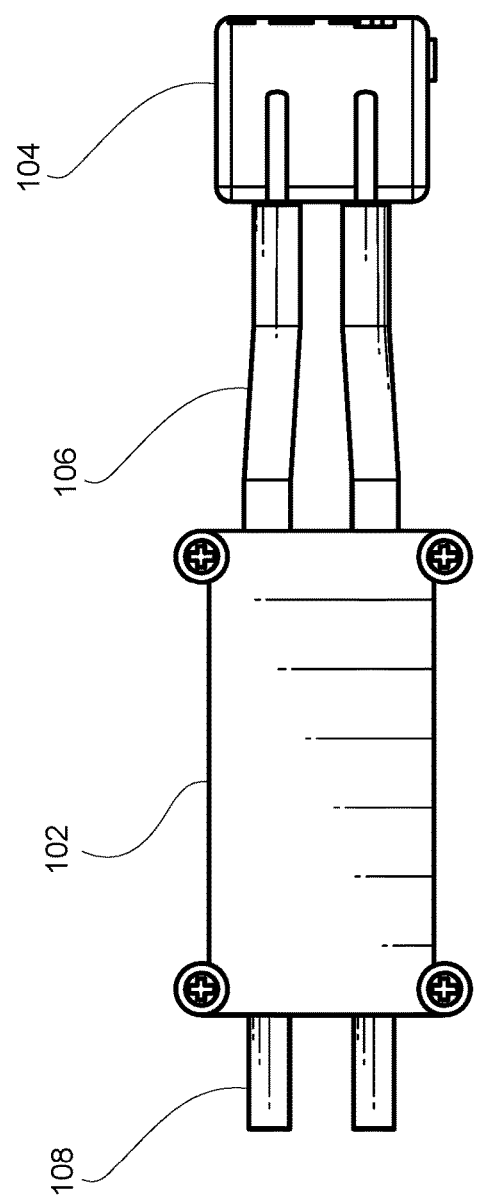
FIG. 1 is an illustration of an exemplary apparatus for reducing chassis depths in connection with power supply units.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure describes various apparatuses, systems, and methods for reducing chassis depths in connection with power supply units. As will be explained in greater detail below, embodiments of the instant disclosure may include and/or involve a terminal connector and an inline terminal block that are physically independent of one another. In some examples, the terminal connector and the inline terminal block may be electrically coupled to one another by a terminal-side power cable. Similarly, the inline terminal block and a power distribution system may be electrically coupled to one another by a distribution-side power cable.

In such examples, the terminal connector may be electrically coupled to a power interface on the back of a computing device's chassis and/or housing. Although the terminal connector is electrically coupled to the power interface on the back of the chassis and/or housing, the inline terminal block may be mounted and/or fixed to a side of the chassis and/or housing. By mounting and/or fixing the inline terminal block to the side of the chassis and/or housing instead of maintaining such a terminal block in the back of the chassis and/or housing, embodiments of the instant disclosure may be able to reduce and/or decrease the overall depth requirement of the computing device, thereby mitigating and/or improving the spatial challenges or constraints faced in the corresponding datacenter and/or by its administrator.

The following will provide, with reference to FIG. 1-7, detailed descriptions of an exemplary apparatuses, systems, configurations, and/or implementations for reducing chassis depths in connection with power supply units. In addition, the discussion corresponding to FIG. 8 will provide a detailed description of an exemplary method for reducing chassis depths in connection with power supply units.

FIG. 1 illustrates an exemplary apparatus 100 for reducing chassis depths in connection with power supply units. In some examples, exemplary apparatus 100 may represent all or a portion of a power supply unit that facilitates the delivery of electric power to a computing device (not necessarily illustrated in FIG. 1). As illustrated in FIG. 1, exemplary apparatus 100 may include and/or represent a terminal connector 104 configured to be electrically coupled to a power interface of the computing device. In addition, apparatus 100 may also include and/or represent an inline terminal block assembly 102 that is physically independent of terminal connector 104.

As further illustrated in FIG. 1, exemplary apparatus 100 may include and/or represent at least one terminal-side power cable 106 configured to be electrically coupled between terminal connector 104 and inline terminal block assembly 102. In addition, exemplary apparatus 100 may include and/or represent at least one distribution-side power cable 108 configured to be electrically coupled between inline terminal block assembly 102 and a power distribution system (not necessarily illustrated in FIG. 1).

In some examples, terminal connector 104 may include and/or represent a structure, housing, and/or connection mechanism that facilitates electrically coupling terminal-side power cable 106 to the computing device. In one example, terminal connector 104 may include and/or represent one or more terminal lugs (e.g., single-holed lugs) electrically coupled to terminal-side power cable 106. Additionally or alternatively, terminal connector 104 may cover and/or at least partially enclose one or more terminal lugs (e.g., a single-holed lugs) electrically coupled to terminal-side power cable 106.

Terminal connector 104 may be of various shapes and/or dimensions. In some examples, terminal connector 104 may form a square, a rectangle, a cube, and/or a cuboid. Additional examples of shapes formed by terminal connector 104 include, without limitation, ovals, circles, cylinders, disks, variations or combinations of one or more of the same, and/or any other suitable shapes.

Terminal connector 104 may be sized in a particular way to house and/or cover one or more terminal lugs coupled to terminal-side power cable 106. Ideally, terminal connector 104 may be as small as possible to facilitate reducing the overall depth and/or size of the chassis or housing of the computing device. Terminal connector 104 may include and/or contain any of a variety of materials. Examples of such materials include, without limitation, plastics, ceramics, polymers, composites, metals, variations or combinations of one or more of the same, and/or any other suitable materials.

In some examples, inline terminal block assembly 102 may include and/or represent a structure, housing, and/or connection mechanism that facilitates electrically coupling distribution-side power cable 108 to terminal-side power cable 106. In one example, inline terminal block assembly 102 may include and/or represent one or more terminal lugs (e.g., two-holed lugs) electrically coupled to distribution-side power cable 108 and/or terminal-side power cable 106. Additionally or alternatively, inline terminal block assembly 102 may cover and/or at least partially enclose one or more terminal lugs (e.g., two-holed lugs) electrically coupled to distribution-side power cable 108 and/or terminal-side power cable 106.

Inline terminal block assembly 102 may be of various shapes and/or dimensions. In some examples, inline terminal block assembly 102 may form a square, a rectangle, a cube, and/or a cuboid. Additional examples of shapes formed by inline terminal block assembly 102 include, without limitation, ovals, circles, cylinders, disks, variations or combinations of one or more of the same, and/or any other suitable shapes.

Inline terminal block assembly 102 may be sized in a particular way to house and/or cover one or more terminal lugs coupled to terminal-side power cable 106. Ideally, inline terminal block assembly 102 may be as small as possible to facilitate reducing the overall width, length, and/or size of the chassis or housing of the computing device. Inline terminal block assembly 102 may include and/or contain any of a variety of materials. Examples of such materials include, without limitation, plastics, ceramics, polymers, composites, metals, variations or combinations of one or more of the same, and/or any other suitable materials.

In some examples, apparatus 100 may serve as an electrical interface and/or conduit between a power distribution system (not necessarily illustrated in FIG. 1) and the computing device. Accordingly, apparatus 100 may carry and/or transfer electric current and/or power (e.g., direct current and/or power) from the power distribution system to the computing device.

Figure 2:
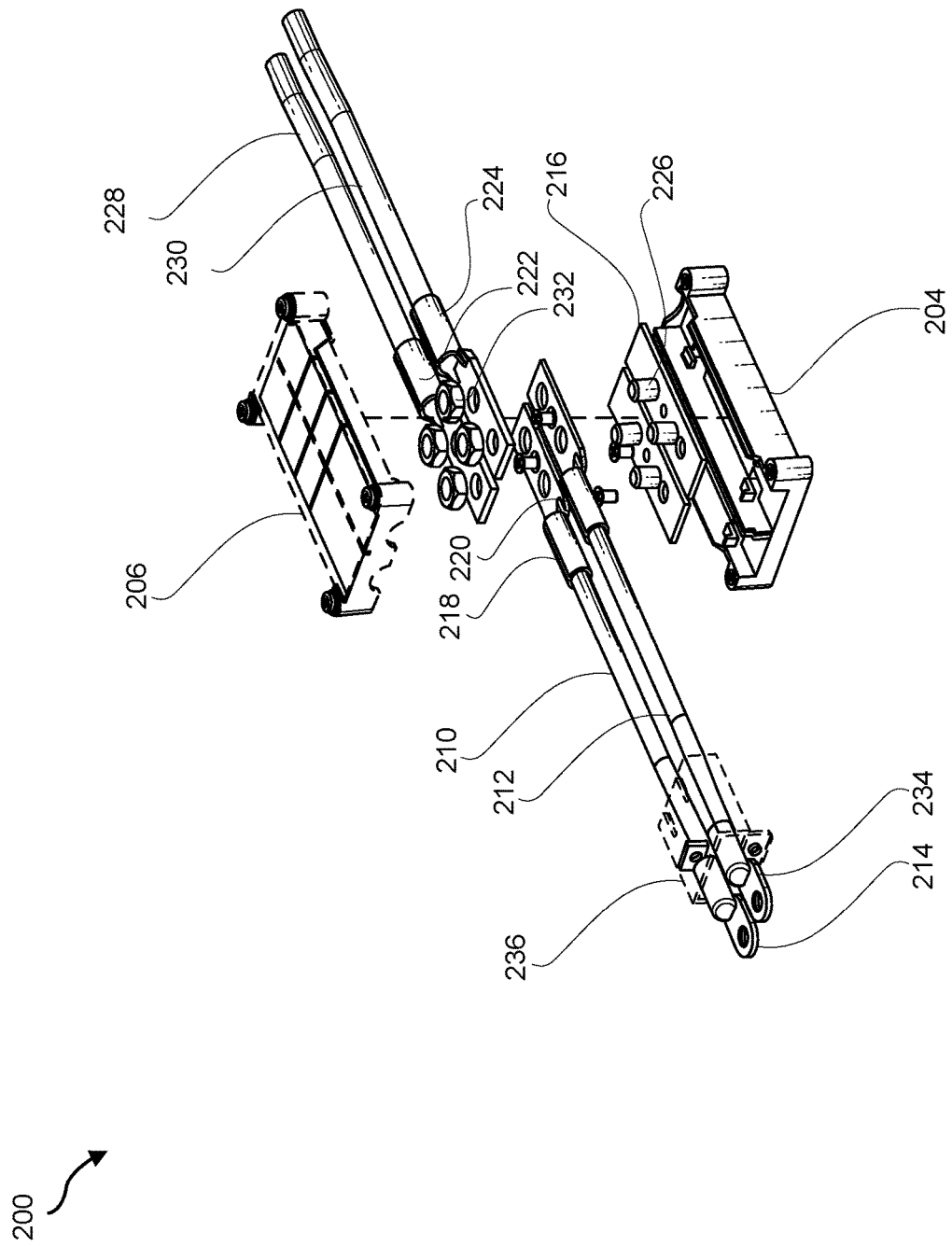
FIG. 2 is an illustration of an exemplary apparatus for reducing chassis depths in connection with power supply units.

FIG. 2 illustrates an exploded view of exemplary apparatus 200 for reducing chassis depths in connection with power supply units. As illustrated in FIG. 2, exemplary apparatus 200 may include and/or represent terminal connector 104, inline terminal block assembly 102, terminal-side power cable 106, and distribution-side power cable 108. In some examples, terminal connector 104 may include and/or represent a terminal cover 236 that at least partially envelops and/or encloses single-holed lugs 214 and 234, respectively. Terminal cover 236 may exhibit various colors. In one example, terminal cover 236 may be transparent in color.

In some examples, inline terminal block assembly 102 may include and/or represent a block base 204 and a block cover 206 capable of being physically coupled together. When coupled together in this way, block base 204 and block cover 206 may secure, support, and/or at least partially envelope or enclose a bus bar 216. Block base 204 and block cover 206 may exhibit various colors. In one example, block base 204 and/or block cover 206 may be black in color.

In some examples, terminal-side power cable 106 may include and/or represent a positive cable 210 and a negative cable 212. As illustrated in FIG. 2, positive cable 210 may be terminated with single-holed lug 214 at the end incorporated into and/or covered by terminal connector 104. Additionally or alternatively, positive cable 210 may be terminated with double-holed lug 218 at the end incorporated into and/or covered by inline terminal block assembly 102.

Similarly, negative cable 212 may be terminated with single-holed lug 234 at the end incorporated into and/or covered by terminal connector 104. Additionally or alternatively, negative cable 212 may be terminated with double-holed lug 220 at the end incorporated into and/or covered by inline terminal block assembly 102.

In some examples, distribution-side power cable 108 may include and/or represent a positive cable 228 and a negative cable 230. As illustrated in FIG. 2, positive cable 228 may be terminated with double-holed lug 222 at the end incorporated into and/or covered by inline terminal block assembly 102. Additionally or alternatively, negative cable 230 may be terminated with double-holed lug 224 at the end incorporated into and/or covered by inline terminal block assembly 102.

Terminal-side power cable 106 and distribution-side power cable 108 may each be of various shapes and/or dimensions. Terminal-side power cable 106 and distribution-side power cable 108 may each be sized in a particular way to ensure the capability of transferring and/or carrying a certain amount of electric power (e.g., 2200 watts). In one example, terminal-side power cable 106 may include and/or represent 6 American Wire Gauge (AWG) wiring and/or cabling of approximately 10 inches in length. Additionally or alternatively, distribution-side power cable 108 may include and/or represent 4 AWG wiring and/or cabling.

In some examples, bus bar 216 may electrically couple terminal-side power cable 106 and distribution-side power cable 108 to one another. In one example, bus bar 216 may be set and/or fixed in block base 204. In this example, bus bar 216 may include and/or form one or more sets of studs 226 configured to support one or more electrical couplings between terminal-side power cable 106 and distribution-side power side 108. For example, studs 226 may protrude from bus bar 216 as posts onto which the lugs of terminal-side power cable 106 and distribution-side power side 108 are secured and/or placed for establishing electrical coupling(s). In this example, the holes of the lugs may be set and/or placed over or onto studs 226 of bus bar 216. One or more sets of nuts 232 may be applied, secured, and/or screwed atop the lugs of terminal-side power cable 106 and distribution-side power side 108 on studs 226.

In a specific embodiment, bus bar 216 may include a pair of 2.5 millimeter copper plates that each have a pair of M6-sized studs. In this embodiment, nuts 232 may include and/or represent four M6-sized nuts that mate with the M6-sized studs of bus bar 216. Additionally or alternatively, the various terminal lugs may each include and/or represent a 4 AWG and/or 6 AWG single-holed barrel and/or rectangular lug.

The various components of apparatus 200 in FIG. 2 may include and/or contain any of a variety of materials (e.g., electrically conductive materials). For example, terminal-side power cable 106, distribution-side power cable 108, bus bar 216, and lugs 214, 234, 218, and 220 may each include and/or contain copper materials. Additional examples of such materials include, without limitation, copper, aluminum, silver, gold, alloys of one or more of the same, combinations or variations of one or more of the same, and/or any other suitable materials.

Figure 3:
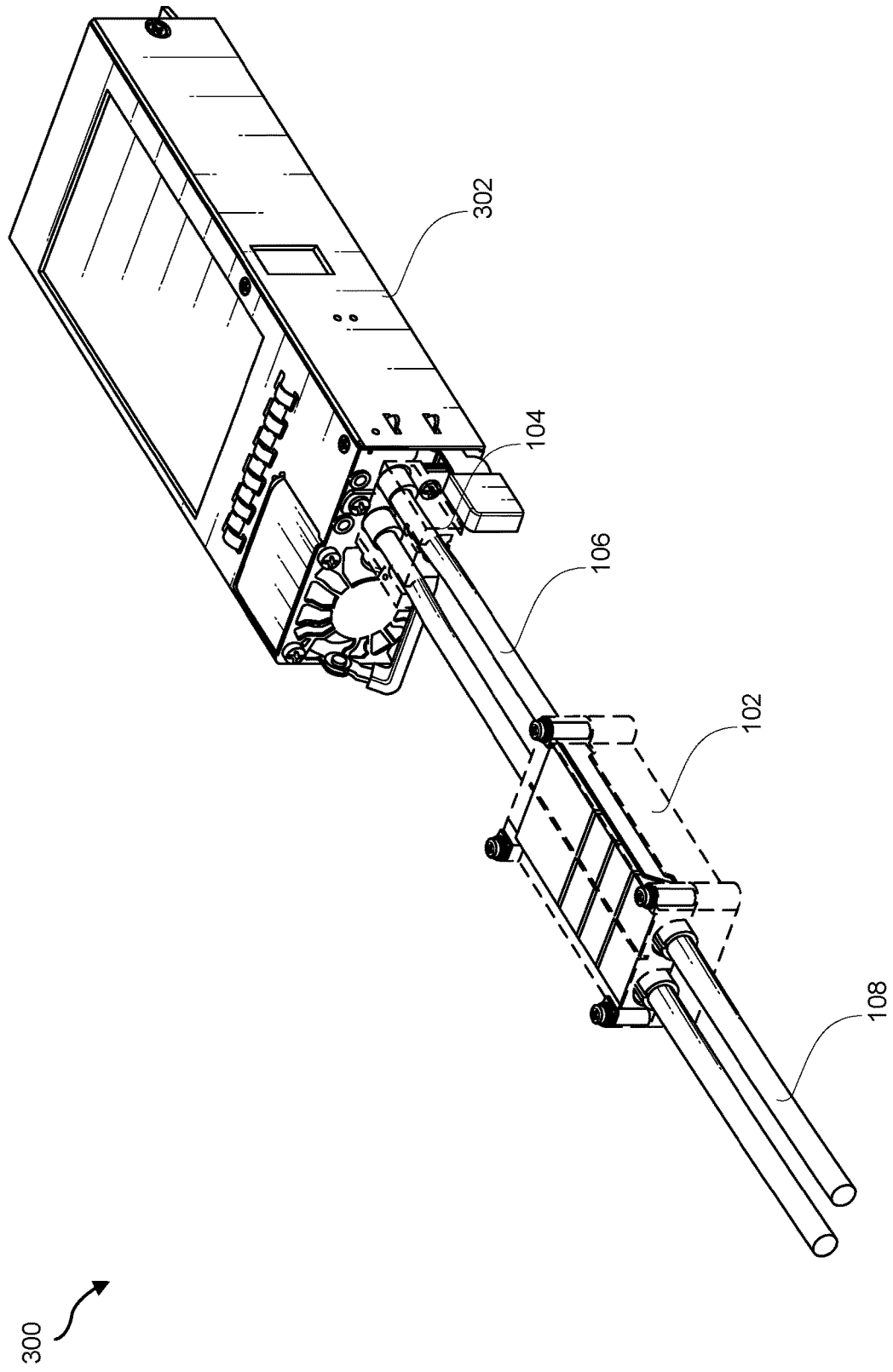
FIG. 3 is an illustration of an exemplary system for reducing chassis depths in connection with power supply units.
Figure 4:
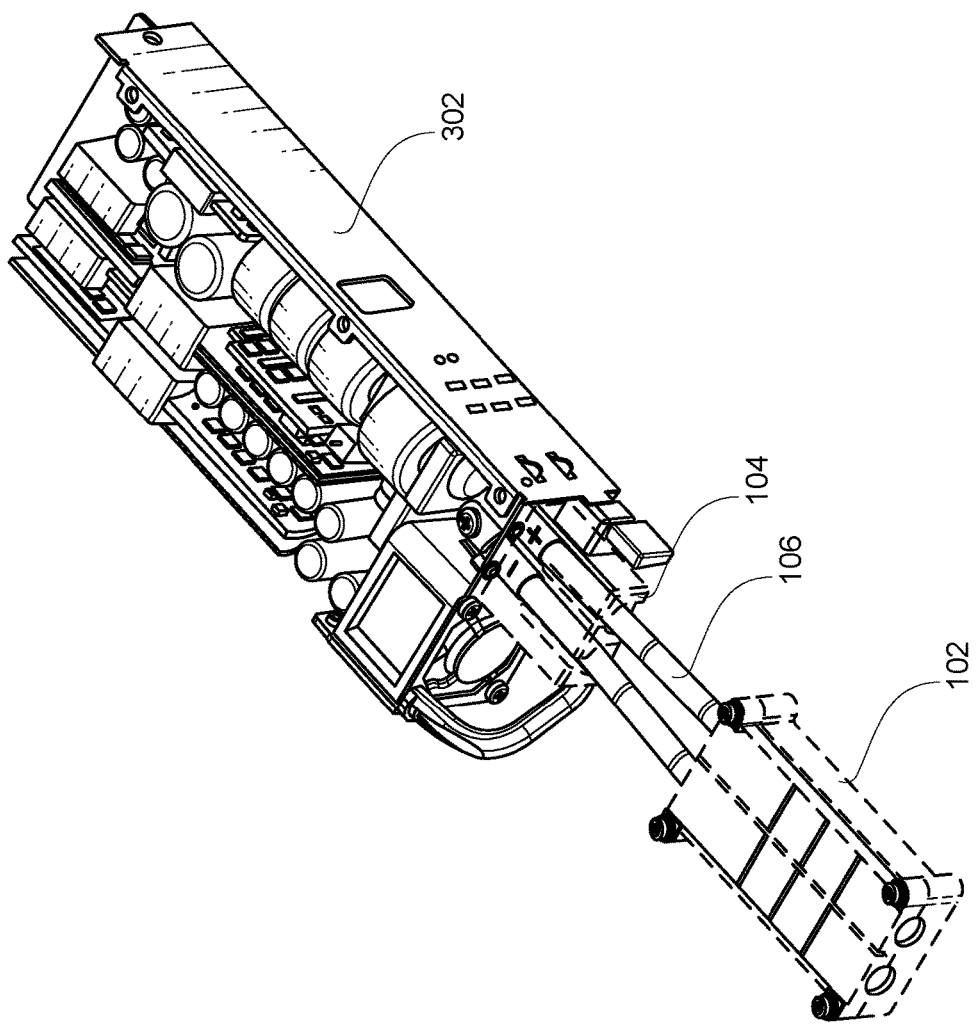
FIG. 4 is an illustration of an additional exemplary system for reducing chassis depths in connection with power supply units.
Figure 5:
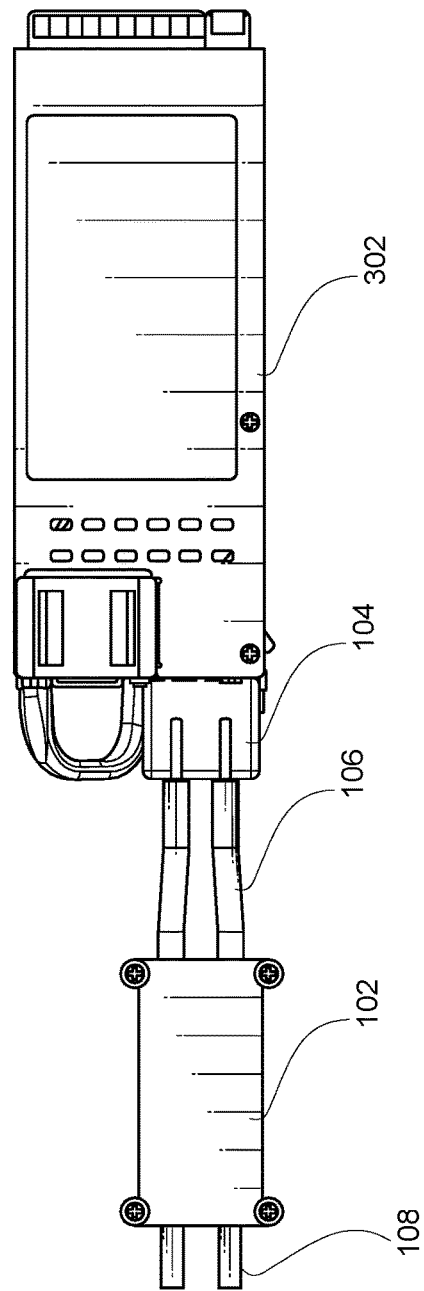
FIG. 5 is an illustration of an additional exemplary system for reducing chassis depths in connection with power supply units.

FIGS. 3-5 illustrate different views of an exemplary system 300 for reducing chassis depths in connection with power supply units. As illustrated in FIGS. 3-5, exemplary system 300 may include and/or represent terminal connector 104, inline terminal block assembly 102, terminal-side power cable 106, distribution-side power cable 108, and a computing device 302. In some examples, terminal connector 104 may be electrically coupled to a power interface of computing device 302. In such examples, inline terminal block assembly 102 may be physically independent of terminal connector 104.

In some examples, terminal-side power cable 106 may be electrically coupled between terminal connector 104 and inline terminal block assembly 102. In such examples, distribution-side power cable 108 may be electrically coupled between inline terminal block assembly 102 and a power distribution system.

Computing devices 302 generally represent any type or form of physical computing device capable of reading computer-executable instructions and/or handling network traffic. Examples of computing devices 302 include, without limitation, routers (such as provider edge routers, hub routers, spoke routers, autonomous system boundary routers, and/or area border routers), switches, hubs, modems, bridges, repeaters, gateways (such as Broadband Network Gateways (BNGs)), multiplexers, network adapters, network interfaces, client devices, laptops, tablets, desktops, servers, cellular phones, Personal Digital Assistants (PDAs), multimedia players, embedded systems, wearable devices, gaming consoles, variations or combinations of one or more of the same, and/or any other suitable computing devices.

Figure 6:
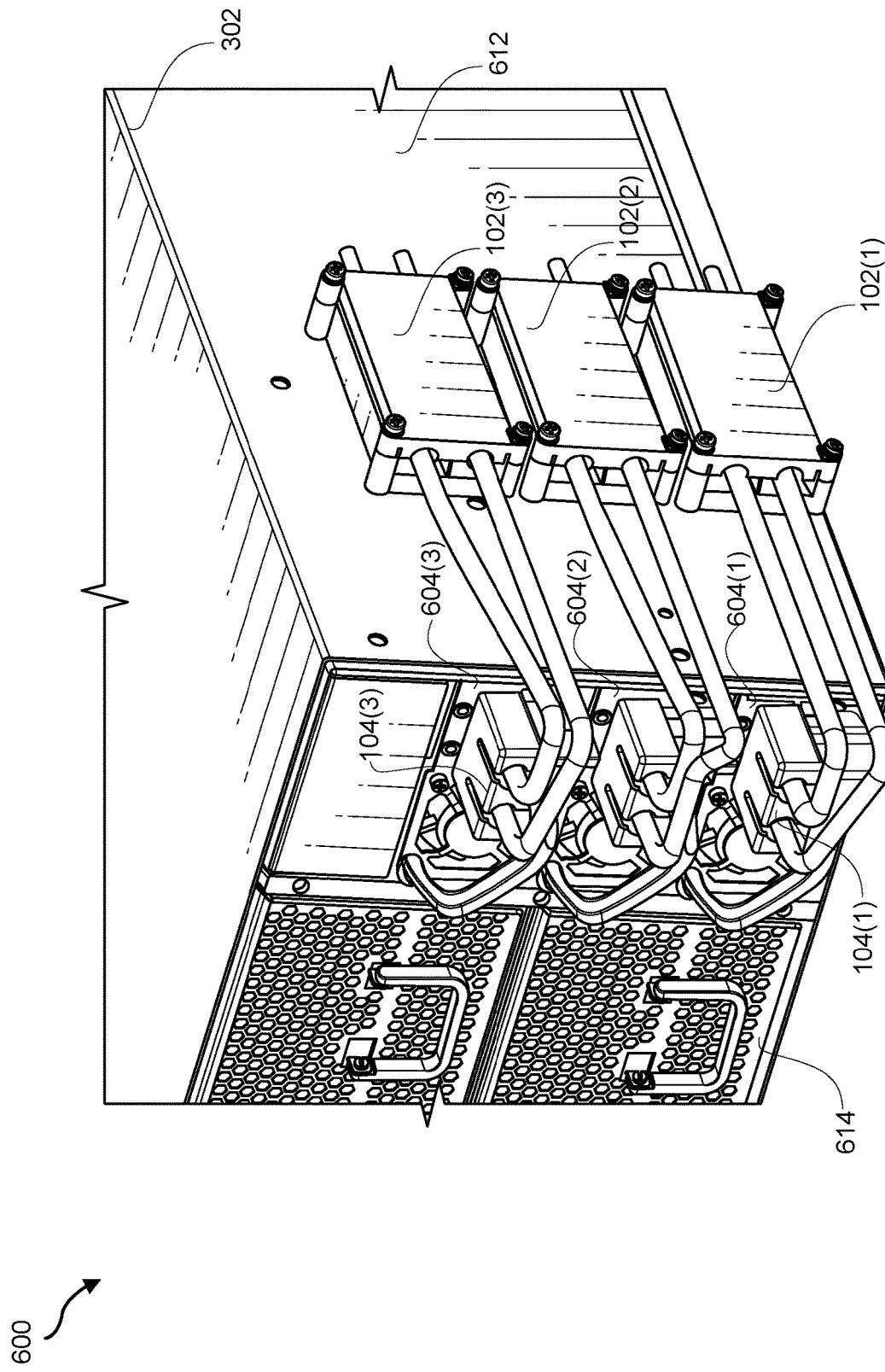
FIG. 6 is an illustration of an additional exemplary system for reducing chassis depths in connection with power supply units.

FIG. 6 illustrates an exemplary stacked arrangement 600 of inline terminal block assemblies 102(1), 102(2), and 102(3) mounted to a side 612 of the housing of computing device 302. As illustrated in FIG. 6, the housing of computing device 302 may include and/or represent side 612 and a back 614. In addition, the housing of computing device 302 may include and/or represent another side opposite side 612 as well as a front opposite back 614.

In some examples, computing device 302 may include and/or incorporate power interfaces 604(1), 604(2), and 604(3) positioned on and/or accessible via back 614 of the housing of computing device 302. As illustrated in FIG. 6, terminal connectors 104(1), 104(2), and 104(3) may be mounted, fixed, and/or coupled to power interfaces 604(1), 604(2), and 604(3), respectively, on back 614 of the housing of computing device 302. In this example, inline terminal block assemblies 102(1), 102(2), and 102(3) may be mounted, fixed, and/or coupled to side 612 of the housing of computing device 302.

Terminal connectors 104(1)-(3) and/or inline terminal block assemblies 102(1)-(3) may be mounted and/or coupled to the housing of computing device 302 in a variety of ways and/or by a variety of attachment mechanisms. Examples of such attachment mechanisms include, without limitation, fasteners, locks, pins, screws, levers, joints, ties, clamps, clasps, stiches, staples, magnets, adhesives, variations or combinations of one or more of the same, and/or any other suitable attachment means.

As illustrated in FIG. 6, stacked arrangement 600 may include and/or involve fixing inline terminal block assemblies 102(1)-(3) in a column and/or a vertical or stacked series. Put differently, in stacked arrangement 600, inline terminal block assemblies 102(1)-(3) may be fixed and/or aligned along a vertical plane of side 612. Moreover, in stacked arrangement 600, each of inline terminal block assemblies 102(1)-(3) may be positioned and/or oriented horizontally relative to the housing and/or chassis of computing device 302. In other words, in stacked arrangement 600, each of inline terminal block assemblies 102(1)-(3) may be positioned and/or oriented with its long side horizonal and/or parallel to the housing and/or chassis of computing device 302. By implementing stacked arrangement 600 in this way, the various embodiments disclosed herein may be able to reduce and/or decrease the overall depth requirement of computing device 302, thereby mitigating and/or improving the spatial challenges or constraints faced in the corresponding datacenter and/or by its administrator.

Figure 7:
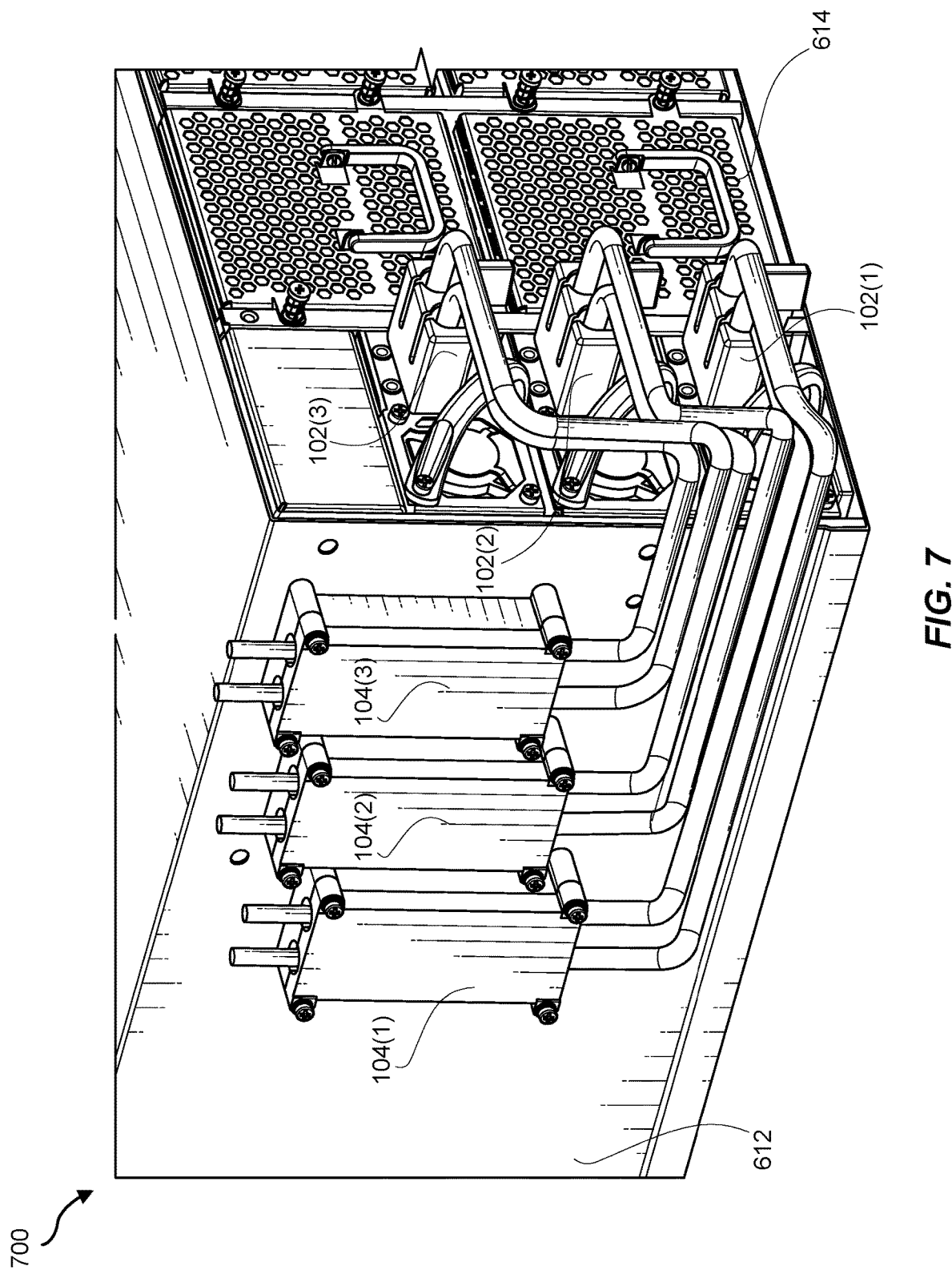
FIG. 7 is an illustration of an additional exemplary system for reducing chassis depths in connection with power supply units.

FIG. 7 illustrates an exemplary staircase arrangement 700 of inline terminal block assemblies 102(1), 102(2), and 102(3) mounted to side 612 of the housing of computing device 302. As illustrated in FIG. 7, staircase arrangement 700 may include and/or involve fixing inline terminal block assemblies 102(1)-(3) in a design and/or progression that resembles a staircase. Put differently, in staircase arrangement 700, inline terminal block assemblies 102(1)-(3) may be fixed and/or aligned along an inclined plane and/or a diagonal of side 612. Moreover, in staircase arrangement 700, each of inline terminal block assemblies 102(1)-(3) may be positioned and/or oriented vertically relative to the housing and/or chassis of computing device 302. In other words, in staircase arrangement 700, each of inline terminal block assemblies 102(1)-(3) may be positioned and/or oriented with its long side vertical, perpendicular, and/or orthogonal to the housing and/or chassis of computing device 302. By implementing staircase arrangement 700 in this way, the various embodiments disclosed herein may be able to reduce and/or decrease the overall depth requirement of computing device 302, thereby mitigating and/or improving the spatial challenges or constraints faced in the corresponding datacenter and/or by its administrator.

Figure 8:
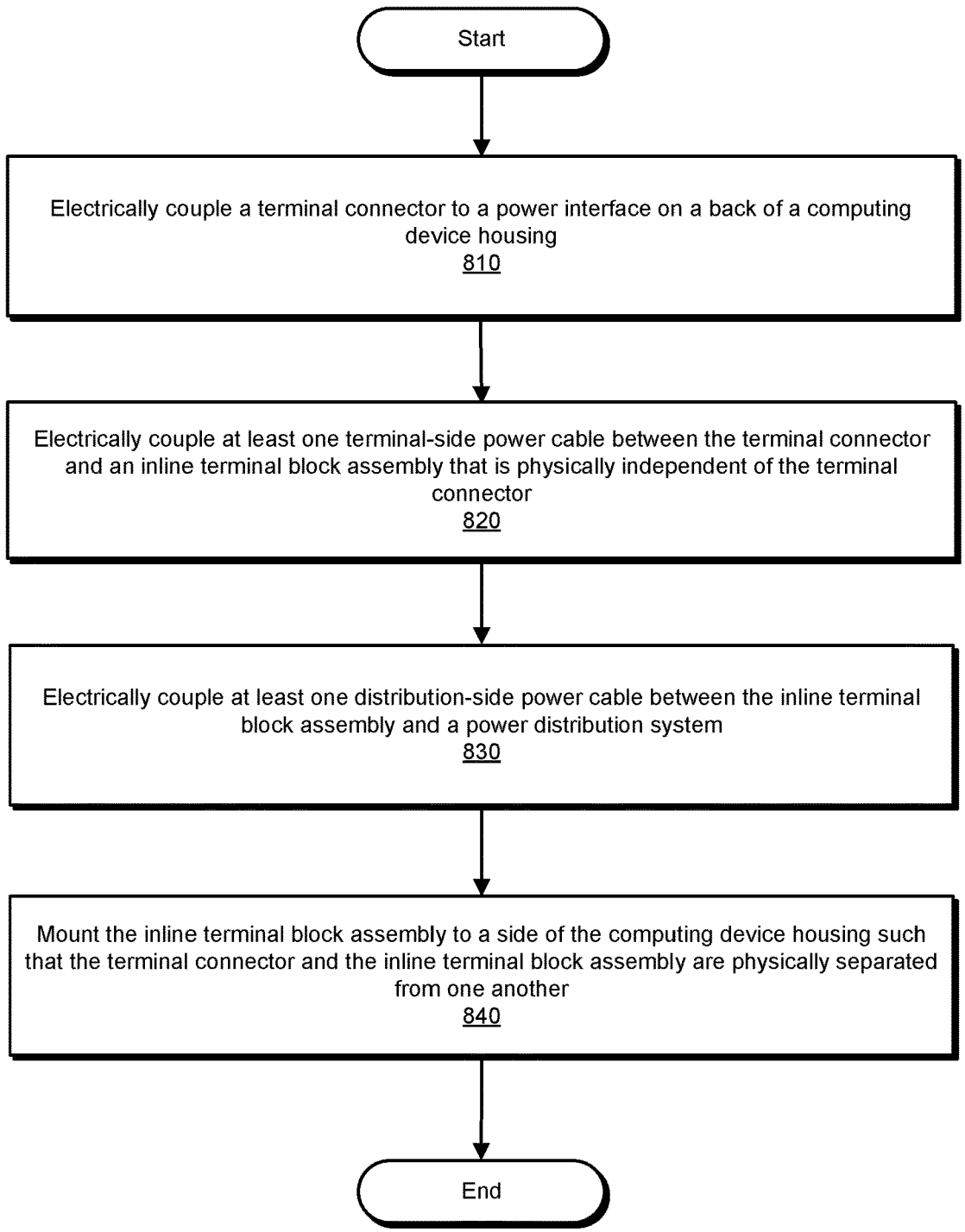
FIG. 8 is a flow diagram of an exemplary method for reducing chassis depths in connection with power supply units.

FIG. 8 is a flow diagram of an exemplary method 800 for reducing chassis depths in connection with power supply units. Method 800 may include the step of electrically coupling a terminal connector to a power interface on a back of a computing device housing (810). Step 810 may be performed in a variety of ways, including any of those described above in connection with FIGS. 1-7. For example, a computing equipment manufacturer, subcontractor, or datacenter administrator may electrically couple a terminal connector to a power interface on a back of a computing device housing. Additionally or alternatively, a robotic and/or automated mechanism may electrically couple a terminal connector to a power interface on a back of a computing device housing.

Method 800 may also include the step of electrically coupling at least one terminal-side power cable between the terminal connector and an inline terminal block assembly that is physically independent of the terminal connector (820). Step 820 may be performed in a variety of ways, including any of those described above in connection with FIGS. 1-7. For example, the computing equipment manufacturer, subcontractor, or datacenter administrator may electrically couple at least one terminal-side power cable between the terminal connector and an inline terminal block assembly that is physically independent of the terminal connector. Additionally or alternatively, a robotic and/or automated mechanism may electrically couple at least one terminal-side power cable between the terminal connector and an inline terminal block assembly that is physically independent of the terminal connector.

Method 800 may further include the step of electrically coupling at least one distribution-side power cable between the inline terminal block assembly and a power distribution system (830). Step 830 may be performed in a variety of ways, including any of those described above in connection with FIGS. 1-7. In one example, the computing equipment manufacturer, subcontractor, or datacenter administrator may electrically couple at least one distribution-side power cable between the inline terminal block assembly and a power distribution system. Additionally or alternatively, a robotic and/or automated mechanism may electrically couple at least one distribution-side power cable between the inline terminal block assembly and a power distribution system.

Method 800 may further include the step of mounting the inline terminal block assembly to a side of the computing device housing such that the terminal connector and the inline terminal block assembly are physically separated from one another (840). Step 840 may be performed in a variety of ways, including any of those described above in connection with FIGS. 1-7. In one example, the computing equipment manufacturer, subcontractor, or datacenter administrator may mount, fix, and/or couple the inline terminal block assembly to a side of the computing device housing such that the terminal connector and the inline terminal block assembly are physically separated from one another. Additionally or alternatively, a robotic and/or automated mechanism may mount, fix, and/or couple the inline terminal block assembly to a side of the computing device housing such that the terminal connector and the inline terminal block assembly are physically separated from one another.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered exemplary in nature since many other architectures can be implemented to achieve the same functionality.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components)

connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. An apparatus comprising:
a terminal connector configured to be electrically coupled to a power interface of a computing device;
an inline terminal block assembly that is physically independent of the terminal connector;
at least one terminal-side power cable configured to be electrically coupled between the terminal connector and the inline terminal block assembly; and
at least one distribution-side power cable configured to be electrically coupled between the inline terminal block assembly and a power distribution system.

2. The apparatus of claim 1, wherein the inline terminal block assembly comprises at least one bus bar that electrically couples the terminal-side power cable to the distribution-side power cable.

3. The apparatus of claim 2, wherein the inline terminal block assembly comprises:
a block base; and
a block cover configured to:
be physically coupled to the block base; and
at least partially enclose the bus bar that electrically couples the terminal-side power cable to the distribution-side power cable.

4. The apparatus of claim 3, wherein the block base and the block cover each comprise at least one plastic material.

5. The apparatus of claim 2, wherein the bus bar comprises at least one set of copper studs configured to support an electrical coupling between the terminal-side power cable to the distribution-side power cable.

6. The apparatus of claim 1, wherein the terminal connector comprises a terminal cover configured to at least partially enclose an electrical coupling between the terminal connector and the power interface.

7. The apparatus of claim 1, wherein the terminal-side power cable and the distribution-side power cable each comprise:
a positive cable terminated with a two-holed lug at one end incorporated into the inline terminal block assembly; and
a negative cable terminated with another two-holed lug at one end incorporated into the inline terminal block assembly.

8. The apparatus of claim 7, wherein the positive cable and the negative cable of the terminal-side power cable are each further terminated with a single-holed lug at another end incorporated into the terminal connector.

9. The apparatus of claim 7, wherein the inline terminal block assembly further comprises:
at least one bus bar that electrically couples the terminal-side power cable to the distribution-side power cable; and
at least one set of nuts configured to:
secure the two-holed lug of the terminal-side power cable and the two-holed lug of the distribution-side power cable to the bus bar; and
secure the another two-holed lug of the terminal-side power cable and the another two-holed lug of the distribution-side power cable to the bus bar.

10. A system comprising:
a computing device;
a terminal connector configured to be electrically coupled to a power interface of the computing device;
an inline terminal block assembly that is physically independent of the terminal connector;
at least one terminal-side power cable configured to be electrically coupled between the terminal connector and the inline terminal block assembly; and
at least one distribution-side power cable configured to be electrically coupled between the inline terminal block assembly and a power distribution system.

11. The system of claim 10, wherein:
the computing device comprises a housing with a front, a back, a side, and another side; and
the power interface of the computing device is accessible via the back of the housing;
the terminal connector is mounted to the back of the housing to facilitate electrically coupling to the power interface; and
the inline terminal block assembly is mounted to the side of the housing.

12. The system of claim 11, wherein the inline terminal block assembly is mounted to the side of the housing in a vertical position relative to the side of the housing.

13. The system of claim 12, further comprising:
at least one additional terminal connector configured to be electrically coupled to an additional power interface of the computing device that is accessible via the back of the housing;
at least one additional inline terminal block assembly that is physically independent of the additional terminal connector;
at least one additional terminal-side power cable configured to be electrically coupled between the additional terminal connector and the additional inline terminal block assembly; and
at least one distribution-side power cable configured to be electrically coupled between the additional inline terminal block assembly and the power distribution system, wherein:
the additional terminal connector is mounted to the back of the housing to facilitate electrically coupling to the additional power interface; and
the additional inline terminal block assembly is mounted to the side of the housing in a vertical position alongside the inline terminal block assembly.

14. The system of claim 13, wherein the inline terminal block assembly and the additional inline terminal block assembly are fixed in a staircase arrangement along an inclined plane of the side of the housing.

15. The system of claim 11, wherein the inline terminal block assembly is mounted to the side of the housing in a horizontal position relative to the side of the housing.

16. The system of claim 15, further comprising:
at least one additional terminal connector configured to be electrically coupled to an additional power interface of the computing device that is accessible via the back of the housing;
at least one additional inline terminal block assembly that is physically independent of the additional terminal connector;
at least one additional terminal-side power cable configured to be electrically coupled between the additional terminal connector and the additional inline terminal block assembly; and at least one distribution-side power cable configured to be electrically coupled between the additional inline terminal block assembly and the power distribution system, wherein:
- the additional terminal connector is mounted to the back of the housing to facilitate electrically coupling to the additional power interface; and
- the additional inline terminal block assembly is mounted to the side of the housing in a horizontal position alongside the inline terminal block assembly.

17. The system of claim 16, wherein the inline terminal block assembly and the additional inline terminal block assembly are fixed in a stacked arrangement along a vertical plane of the side of the housing.

18. The system of claim 10, wherein the inline terminal block assembly comprises at least one bus bar that electrically couples the terminal-side power cable to the distribution-side power cable.

19. The system of claim 18, wherein the inline terminal block assembly comprises:
- a block base; and
- a block cover configured to:
  - be physically coupled to the block base; and
  - at least partially enclose the bus bar that electrically couples the terminal-side power cable to the distribution-side power cable.

20. A method comprising:
- electrically coupling a terminal connector to a power interface on a back of a computing device housing;
- electrically coupling at least one terminal-side power cable between the terminal connector and an inline terminal block assembly that is physically independent of the terminal connector;
- electrically coupling at least one distribution-side power cable between the inline terminal block assembly and a power distribution system; and
- mounting the inline terminal block assembly to a side of the computing device housing such that the terminal connector and the inline terminal block assembly are physically separated from one another.

* * * * *